United States Patent
Lin et al.

(10) Patent No.: US 9,490,217 B1
(45) Date of Patent: Nov. 8, 2016

(54) OVERLAY MARKS AND SEMICONDUCTOR PROCESS USING THE OVERLAY MARKS

(71) Applicant: UNITED MICROELECTRONICS CORP., Hsin-Chu (TW)

(72) Inventors: Chia-Ching Lin, Kaohsiung (TW); En-Chiuan Liou, Tainan (TW); Chia-Hung Wang, Taichung (TW); Sho-Shen Lee, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/687,912

(22) Filed: Apr. 15, 2015

(51) Int. Cl.
*H01L 23/544* (2006.01)
*H01L 21/68* (2006.01)
*H01L 29/78* (2006.01)

(52) U.S. Cl.
CPC ........... *H01L 23/544* (2013.01); *H01L 29/785* (2013.01); *H01L 2223/5442* (2013.01); *H01L 2223/54426* (2013.01)

(58) Field of Classification Search
CPC ................. H01L 2223/54426; H01L 23/544; H01L 223/5442; H01L 29/78; H01L 2223/544532; H01L 2223/54453; H01L 2223/5442; H01L 2924/0002; H01L 2924/00; G03F 9/7076

See application file for complete search history.

(56) References Cited

U.S. PATENT DOCUMENTS

| | | | |
|---|---|---|---|
| 6,063,688 A | 5/2000 | Doyle | |
| 7,177,457 B2 | 2/2007 | Adel | |
| 8,525,994 B2 * | 9/2013 | Abdulhalim | G03F 7/70633 356/400 |
| 8,729,716 B2 | 5/2014 | Chuang | |
| 8,804,137 B2 * | 8/2014 | Choi | G03F 7/70633 356/620 |
| 8,822,343 B2 | 9/2014 | Hsieh | |
| 2014/0367869 A1 | 12/2014 | Hsieh | |
| 2015/0056792 A1 | 2/2015 | Adam | |

* cited by examiner

*Primary Examiner* — Jasmine Clark
(74) *Attorney, Agent, or Firm* — Winston Hsu; Scott Margo

(57) ABSTRACT

An overlay mark for determining the alignment between two separately generated patterns formed along with two successive layers above a substrate is provided in the present invention, wherein both the substrate and the overlay mark include at least two pattern zones having periodic structures with different orientations, and the periodic structures of the overlay mark are orthogonally overlapped with the periodic structures of the substrate.

20 Claims, 6 Drawing Sheets

US 9,490,217 B1

OVERLAY MARKS AND SEMICONDUCTOR PROCESS USING THE OVERLAY MARKS

BACKGROUND OF THE INVENTION

1. Field of the Invention

The present invention relates generally to overlay measurement techniques, which are used in semiconductor manufacturing processes or system integration tests. More specifically, the present invention relates to overlay marks for measuring alignment error between different layers or different patterns on the same layer of a semiconductor wafer stack and the semiconductor process using the overlay marks.

2. Description of the Prior Art

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET). A typical FinFET is fabricated with a thin "fin" (or fin structure) extending from a substrate, for example, etched into a silicon layer of the substrate. The channel of the FET is formed in this vertical fin. A gate is provided over (e.g., wrapping) the fin. It is beneficial to have a gate on both sides of the channel allowing gate control of the channel from both sides. Advantages of FinFET devices include reducing the short channel effect and higher current flow.

Because of the complexity inherent in nonplanar devices, such as FinFETs, a number of techniques used in manufacturing planar transistors must be redesigned for manufacturing nonplanar devices. For example, mask overlay and alignment techniques may require further design efforts. ICs (integrated circuits) are typically assembled by layering features on a semiconductor wafer using a set of photolithographic masks. Each mask in the set has a pattern formed by transmissive or reflective regions. During a photolithographic exposure, radiation such as ultraviolet light passes through or reflects off the mask before striking a photoresist coating on the wafer. The mask transfers the pattern onto the photoresist, which is then selectively removed to reveal the pattern. The wafer then undergoes processing steps that take advantage of the shape of the remaining photoresist to create circuit features on the wafer. When the processing steps are complete, photoresist is reapplied and wafer is exposed using the next mask. In this way, the features are layered to produce the final circuit.

Regardless of whether a mask is error-free, if all or part of the mask is not aligned properly, the resulting features may not align correctly with adjoining layers. This can result in reduced device performance or complete device failure. To measure mask alignment, overlay (OVL) marks are formed on the wafer. Overlay marks typically consist of layers of material arranged in patterns that are both recognizable and that provide identifiable reference points. While existing overlay marks have been generally adequate for planar devices, they have not been entirely satisfactory for manufacturing nonplanar devices.

The measurement of overlay error between successive patterned layers on a wafer is one of the most critical process control techniques used in the manufacturing of integrated circuits and devices. Overlay accuracy generally pertains to the determination of how accurately a first patterned layer aligns with respect to a second patterned layer disposed above or below it and to the determination of how accurately a first pattern aligns with respect to a second pattern disposed on the same layer. Presently, overlay measurements are performed via test patterns that are printed together with layers of the wafer. The images of these test patterns are captured via an imaging tool and an analysis algorithm is used to calculate the relative displacement of the patterns from the captured images.

Although such designs have worked well, the overlay/alignment measurement is readily affected by the underlying patterns, such as fins or mandrels formed on the substrate, thereby the measurement noise and error are increased. This influence would be even worse when the overlay/alignment marks and underlying patterns have the same or similar orientation. Therefore, there are still continuing efforts for those ordinarily skilled in the art to provide a better alignment mark and measurement method with improved functionality and accuracy.

SUMMARY OF THE INVENTION

This invention will describe a novel configuration of correspondingly arranging and disposing the overlay/alignment marks based on their underlying patterns. The configuration would significantly reduce the measurement noise and error resulted from geometrical similar overlapped patterns, especially for those patterns with the same orientation.

One objective of the present invention is to provide an overlay mark formed along with two successive layers above a substrate, wherein both the substrate and the overlay mark comprise at least two pattern zones having periodic structures with different orientations, and the periodic structures of overlay mark formed along with at least one of two successive layers are orthogonally overlapped with the periodic structures of the substrate.

Another objective of the present invention is to provide an overlay mark formed along with two successive layers above a substrate, wherein both substrate and overlay mark comprise only one pattern zone having periodic structures, and the periodic structures of overlay mark formed along with at least one of two successive layers are orthogonally overlapped with the periodic structures of the substrate.

Still another objective of the present invention is to provide a semiconductor process of forming overlay marks, which includes the steps of patterning a substrate to form periodic structures in at least two pattern zones, wherein the periodic structures indifferent pattern zones have different orientations, and forming two successive layers with respective overlay marks on the substrate, wherein both overlay marks have at least two pattern zones, wherein the pattern zone has periodic structures with different orientations, and the periodic structures of two successive layers are orthogonally overlapped with the periodic structures of the substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

Figure 1:
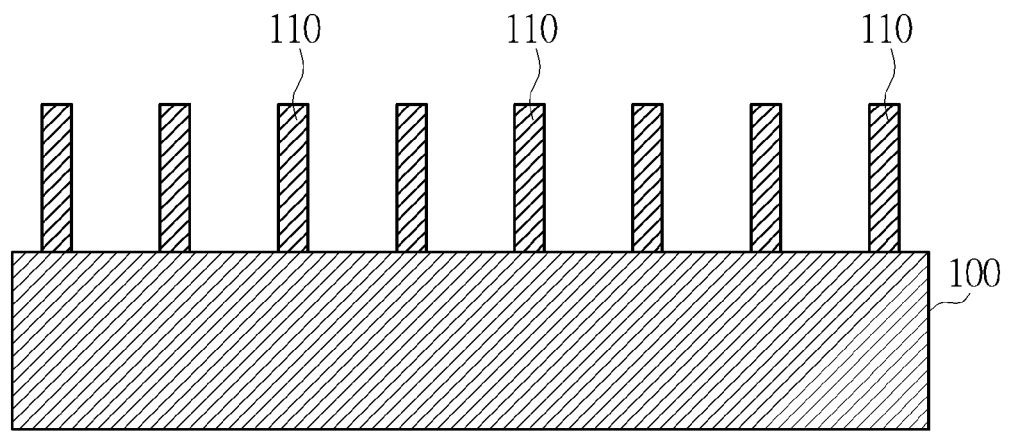
FIGS. 1-8 are cross-sectional views depicting an exemplary process flow of forming overlay/alignment marks on a substrate with specific configuration in accordance with the embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

The present invention, in each of the various embodiments, uses overlay marks that are composed of periodic structures formed on each of two layers of a semiconductor wafer to provide overlay information between those two layers of the semiconductor device. The overlay marks are formed in specific locations on each wafer layer such that the periodic structures on one layer will be aligned with the periodic structures on the other layer when the two layers are properly aligned. Conversely, the periodic structures on each layer will be offset from each other when the two layers are not properly aligned. Alternatively, the present invention may use overlay marks that are composed of periodic structures formed on a single layer by two or more separate processes to provide alignment information between two different patterns on the same layer. Each of the periodic structures is composed of a plurality of structures, which increases the amount of information that may be used to measure overlay, and which may be widely modified to diminish the impact of certain processes on the overlay measurements. Each of these structures is composed of substructures that are about the same size and pitch (e.g., separation) as structures of the actual integrated circuits. By forming each of the periodic structures with substructures that are sized closer to the size of the actual circuits, a more accurate measurement of any alignment error in such circuits is obtained. The invention is particularly suitable for overlay measurement techniques that require capturing an image of the overlay mark.

The periodic structures and sub-structures described herein are generally patterned using suitable photolithographic techniques, and the lithographic patterns are subsequently transferred to other materials and layers using established processing techniques such as etching and deposition. In the simplest application, the transferred patterns constitute etched or deposited lines or vias. For example, the periodic structures and sub-structures may be formations of photoresist material, recessed cavity formations, embedded trenches and/or other structures within a wafer layer. The structures and sub-structures formed by cavities may be cavities formed in any of the layers during the semiconductor fabrication process. For example, the cavities may be formed in the photoresist layer, the dielectric material layer, or the metal layers. It should be noted that the above processes are not a limitation and that any suitable fabrication technique may be used.

Embodiments of the invention are discussed below with reference to FIGS. 1-9. However, those skilled in the art will readily appreciate that the detailed description given herein with respect to these figures is for explanatory purposes as the invention extends beyond these limited embodiments.

FIG. 1 shows a semiconductor substrate 100, such as for example, a silicon semiconductor substrate. Overlying substrate 100 is a patterned first material layer 110, such as for example, a silicon nitride ($Si_3N_4$) layer. The first material layer 110 may be patterned by following steps: a photoresist (not shown) is applied and patterned to define resist lines on the first material layer 110. The application and patterning of photoresist lines is done in accordance with known techniques, such as for example with a negative resist and light-field mask. Photoresist lines are used to define spacer portions of first material layer 110, such as for example spacer portions of $Si_3N_4$.

Once resist is patterned, first material layer 110 is etched with a suitable etchant. In the case where first material layer 110 is $Si_3N_4$, a suitable etchant is a $CHF_3/O_2$ chemistry. The etch removes first material layer from the unprotected portions of the substrate leaving pattern first material layer 110 remaining under photoresist. Next, photoresist is removed by conventional techniques. FIG. 1 shows a schematic side view of the structure after the removal of the photoresist. The patterned first material layer 110 is uniformly spaced apart on the substrate 100 with, for example, a width of 0.32 μm and a 0.64 micron space between the resist lines.

Figure 2:
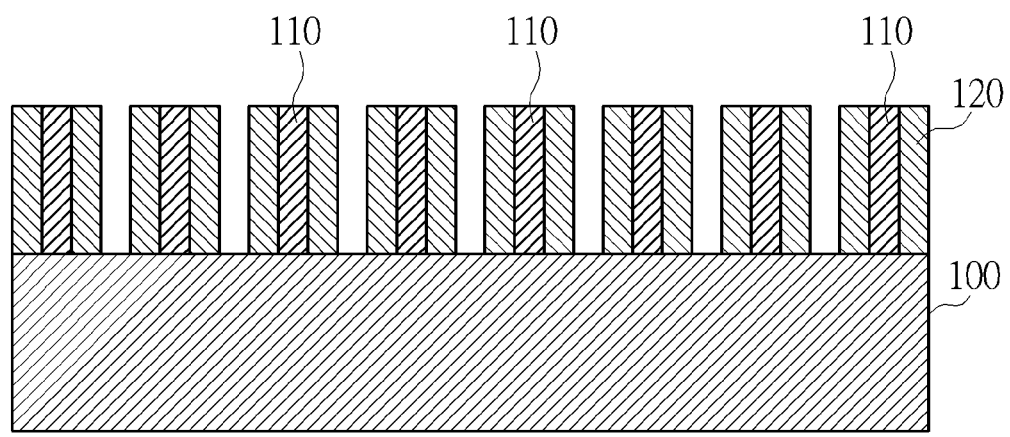

After uniformly patterned first material layer 110 is formed, as shown in FIG. 2, a patterned second material (masking) layer 120 is formed on the substrate 100 adjacent on both sides of each patterned first material layer 110. The patterned second material layer 120 may be formed by following steps: a second masking layer (not shown) is conformally deposited over the patterned first material layer 110 on substrate 100. Second material layer 120 is, for example, a silicon dioxide ($SiO_2$) deposited by conventional techniques, such as for example chemical vapor deposition. Second material portion 130 should be different from the material used to make first material layer 110 to allow a subsequent selective etch to differentiate between the two materials.

In the embodiment shown, the thickness of second material layer 120 is approximately one half of the width of patterned first material layer 110. Thus, for example, where the thickness of patterned first material layer 110 is 0.32 μm, the thickness of second material layer 120 is 0.16 μm. Next, an etchant is used to etch second material layer to form patterned second material layer 120 adjacent patterned first material layers 110. The etchant should be anisotropic to define spacer portions having substantially vertical sidewalls as shown in FIG. 2. For a second material portion 130 of $SiO_2$, a $CHF_3/O_2$ etch chemistry is used to form patterned second material layers (spacers) 120 with substantially vertical sidewalls.

Figure 3:
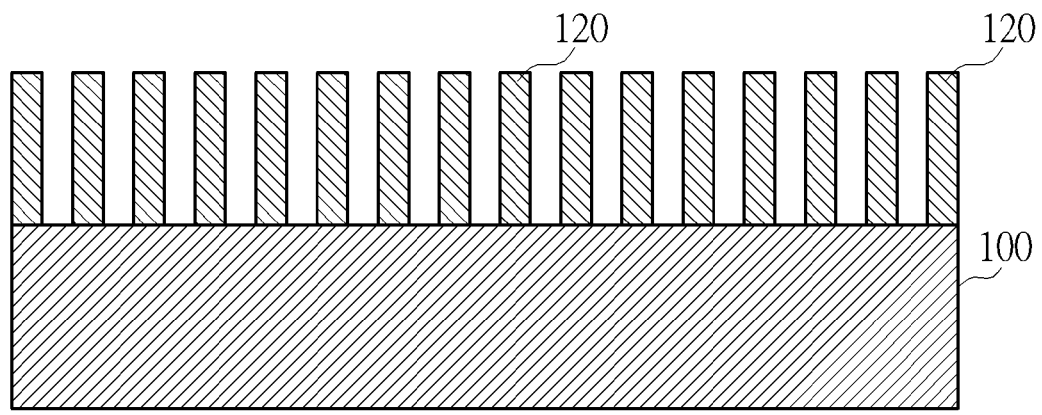

Once second material layers 120 are formed, as shown in FIG. 3, patterned first material layers 110 are removed by a suitable etchant. In this case, an etchant is selected for first material layer 110 that is selective for first material layer 110 and that does not significantly etch second material layers 120. A suitable selective etch for first material layer ($Si_3N_4$) 110 and second material spacer portions ($SiO_2$) 130, to selectively etch $Si_3N_4$ is a wet etch of hot phosphoric acid ($H_3PO_4$). Thus, FIG. 3 shows patterned second material layers (spacers) 120 each having a width of for example 0.16 um on the surface of substrate 100 after the removal of first material layers 110.

FIGS. 1-3 illustrate a process for forming geometrically related spacers. Each spacer 120 is of approximately the same thickness and is separated from one another by approximately the same distance. Please the above process shown in FIGS. 1-3 may be repeated to create even smaller spacer portions, depending on the scale or the feature size of desire device or pattern structure, for example, the fin or trenches structure pre-defined on the substrate.

Figure 4:
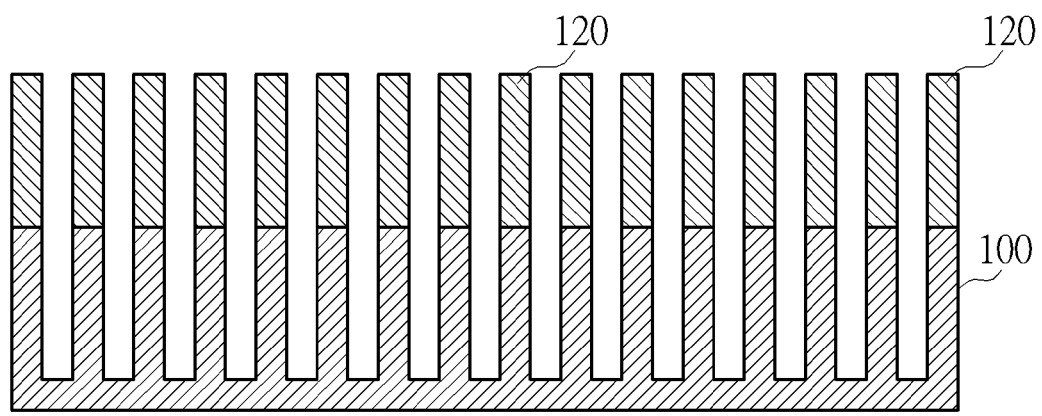
Figure 5:
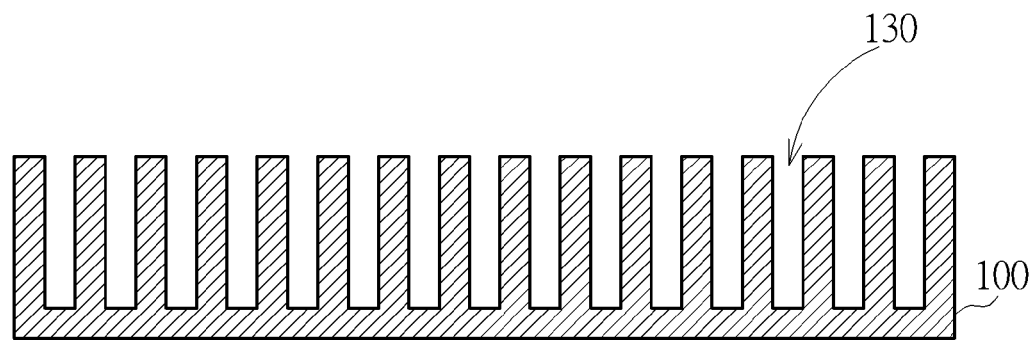
Figure 6:
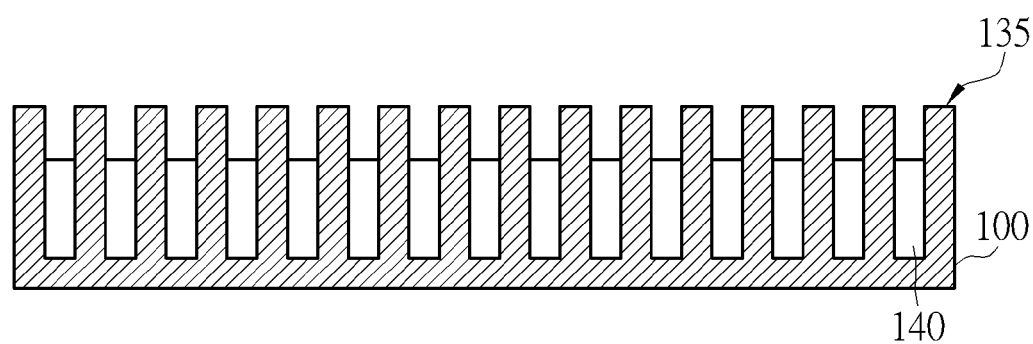

FIGS. 4-6 show an embodiment wherein submicron dimension trenches and isolation are formed in a semiconductor substrate. In FIG. 4, the second material layers 120 (formed with reference to FIGS. 1-3) are used as a masking layer and semiconductor substrate 100 is etched with a suitable etchant to form deep micron trenches with a suitable etchant. For example, the etching of a silicon substrate 100 may be carried out with a chlorine etch chemistry, such as for example, $BCl_3/Cl_2$, $H_2/Cl_2/SiCl_4$, and $CHCl_3/O_2/N_2$, or other suitable etch chemistry as known in the art. Please note that in some embodiment, there is a hard mask (not shown) layer formed between the substrate 100 and the second material layers 120. The pattern of the second material layers 120 will be first transferred to the hard mask, and then the hard mask will be used as an etch mask to etch the substrate 100 and form the trenches.

FIG. 5 shows substrate 100 after the etching of deep submicron trenches 130 and the removal of second material layers 120. The removal of the second material layers 120 is carried out with a suitable etchant that does not etch the silicon substrate. For example, second material layers 120 of $Si_3N_4$ may be etched with a $CHF_3/O_2$ chemistry. Uniformly distributed and parallel trenches 130 are formed on the substrate 100 with identical pitch.

FIG. 6 shows the deep submicron trenches 130 in substrate 100 filled with a dielectric material 140. Dielectric material 140 may be deposited by conventional techniques, such as for example, chemical vapor deposition of dielectric material. Another method is thermal oxidation of silicon. The structure is planarized by a suitable etchant or a chemical-mechanical polish. The filled dielectric material 140 would be further etched back to make a portion of the substrate 100 protruding therefrom, thereby forming submicron fins 135 structure on the substrates. The structure shown in FIG. 6 may be used as a substrate for a MOS transistor having channel lengths in substrate 100 that amount to quantum wires to enhance the mobility of the transistor.

Please note that in the present invention, the fins 135 uniformly formed on the substrate 100 may be considered as a periodic structure. The pitch of the fins 135 may be defined by the perimeter of the double patterning process shown in FIGS. 1-3, such as the width of patterned first material layer 110, the thickness of the second material layer (mask) 120, or the repeated times of the double patterning process. For example, the periodic structure formed in FIG. 5 may be predefined mandrel structure rather than fin structure. Further double patterning process may be performed to transform the predefined mandrels into submicron fins with predetermined finer pitch which is close to the feature sizes of the desired devices. In practice, the substrate 100 may be provided with individual regions with periodic structure of different pitches, such as the pattern zones 180A, 180B, 180C and 180D shown in FIG. 9.

Figure 7:
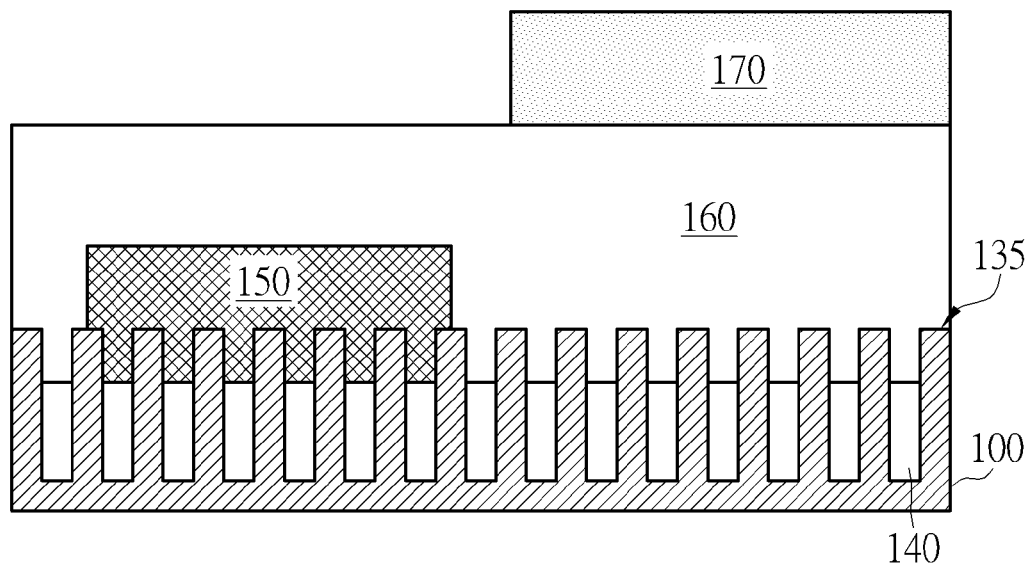
Figure 8:
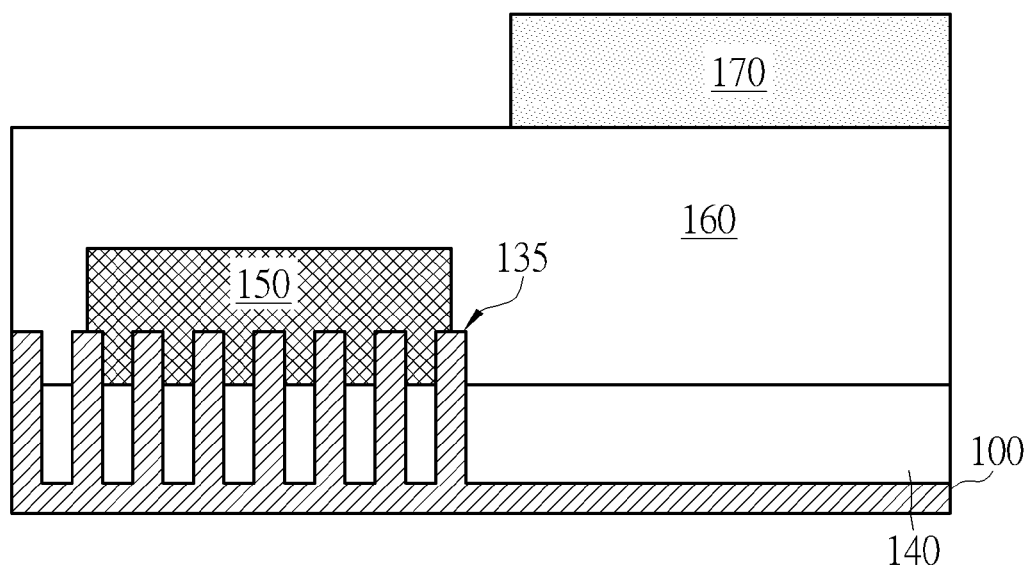

After the fin structures and isolations are formed, successive layers or films will be formed sequentially on the substrate 100 in common semiconductor process. Those successive layers would be provided with overlay or alignment mark, if there are patterns defined in the layers, in order to align the patterns in different layer or the patterns formed in different process in the same layer. As mentioned with respect to the prior art, the measurement of overlay/alignment mark is readily affected by the underlying patterns, such as fins or mandrels formed on the substrate. FIG. 7 shows one or two overlay/alignment marks stacked above a periodic structure of the substrate. FIG. 7 is a cross-sectional view taken along the line A-A' in FIG. 9, which depicts an exemplary configuration of overlay/alignment marks corresponding to the patterns of the substrate in different zones.

Figure 9:
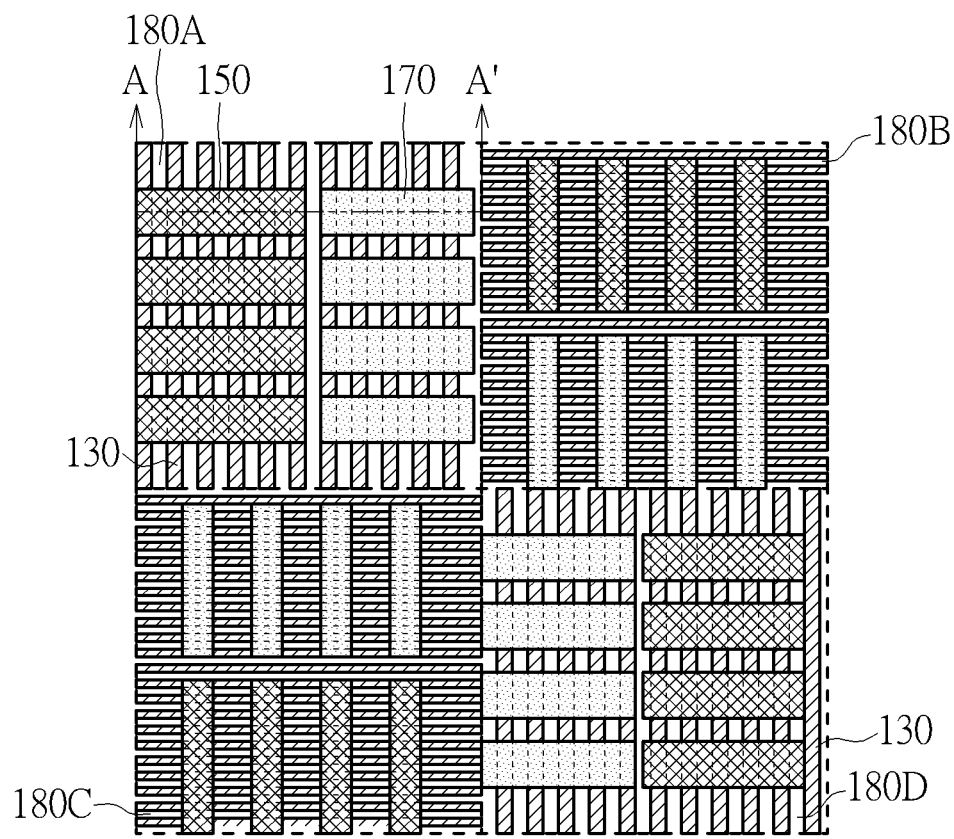
FIGS. 9 and 10 are top views depicting the two configurations of the overlay/alignment marks correspondingly overlapping on the patterns of the substrate in accordance with the embodiment of the present invention.

As shown in FIG. 7, please also refer to the corresponding top view of FIG. 9, a first successive layer (not shown), such as a gate material layer (ex. POLY) for FinFET devices, is first formed on the substrate 100 and traversing across the fins 135. This first successive layer would be provided with a first overlay mark 150 for overlay alignment. This means the first overlay mark 150 is formed along with the first successive layer in the same process. The overlay mark 150 is suitable for image based overlay measurement techniques and is generally provided to determine the relative overlay shift between two or more successive layers of a substrate or between two or more separately generated patterns on a single layer of a substrate. By way of example, the overlay mark may be used to determine how accurately a first layer aligns with respect to a second layer disposed above or below it or how accurately a first pattern aligns relative to a preceding or succeeding second pattern disposed on the same layer.

The mark, such as the overlay marks 150 and 170 shown in FIG. 7, is typically positioned inside the scribe region of the wafer, i.e., the scribe line on the wafer where the wafer is separated into dies via sawing or dicing and thus the circuit itself is not patterned there. However, the overlay/alignment marks in the scribe area are generally formed along with the circuit patterns in the active area (AA) in the same layer level. The scribe line budget, therefore, generally refers to the available space allowed by the scribe line for the placement of the mark. In addition, the lower limits of the perimeter may be set by the minimum area needed by the metrology tool to image the mark (e.g., obtain adequate signal or measurement quality). In addition, the periodic structure on the substrate, such as the fins 135, may also be an alignment mark as a reference for the overlying overlay marks 150 or 170. The mark 135 of the substrate 100 may function as a scale with respect to the overlapped overlay mark in the alignment measurement and to determine the overlay shift.

Please note that in the present invention, as shown in FIG. 9, the first overlay mark 150 is designedly disposed in an orientation orthogonal to the orientation of the periodic structure (ex. fins 135) on the substrate 100. For example, in the pattern zone 180A of the substrate 100, the orientation of the periodic structure (ex. fins 135) of the substrate 100 is the direction of Y-axis, then the first overlay mark 150 overlapped thereon would be designedly disposed in an orientation of the X-axis, which is orthogonal to the Y-axis. Correspondingly, in the pattern zone 180B of the substrate 100, the orientation of the periodic structure 135 of the substrate 100 is the direction of X-axis, then the first overlay mark 150 overlapped thereon would be designedly disposed in an orientation of the Y-axis, which is orthogonal to the X-axis. It can be noted that the pitches of the periodic structure 135 of the substrate 100 is different in different pattern zones 180A-180D, and the corresponding overlay mark 150 disposed thereon would be correspondingly provided with an orthogonal orientation against the underlying patterns. Additionally, the pitches of the overlay marks 150 or 170 may also vary depending on the pitches of the underlying periodic structures 135 of the substrate 100 in different pattern zones 180A-180D.

In the present invention, since the overlay mark 150 is designedly disposed orthogonal to the underlying patterns, the measurement of overlay/alignment between the successive patterned layers and the calculation of image analysis algorithm would be less affected by the outline of the underlying patterns in the same orientation, thereby increasing the measurement accuracy of the overlay and alignment.

Refer again to FIG. 8. After the first successive layer and overlay mark 150 are formed, a dielectric layer 160, such as an inter-layer dielectric (ILD), is formed on the substrate 100 and covers the first overlay mark 150. Next, a second successive layer (not shown), such as a contact photoresist, is formed on the dielectric layer 160. Similarly, this second successive layer would also be provided with second overlay marks 170 for overlay alignment, for example, for the positioning of the contact hole to be precisely landed on the FinFET. The second overlay mark 170 has the same configuration as the first overlay mark 150. The second overlay mark 170 is designedly disposed in an orientation orthogonal to the orientation of the periodic structure (ex. fins 135) on the substrate 100 and is juxtaposed with the first overlay mark 150, as shown in FIG. 9. Since both the first overlay mark 150 and the second overlay mark 170 are designedly disposed orthogonal to the underlying patterns, the measurement of overlay/alignment between the two successive patterned layers, ex. the poly layer, the contact PR, or an inter-layer dielectric with contact patterns formed thereon, are less affected by the outline of the underlying periodic fin structure, thereby the measurement accuracy of the overlay and alignment can be significant increased.

Figure 10:
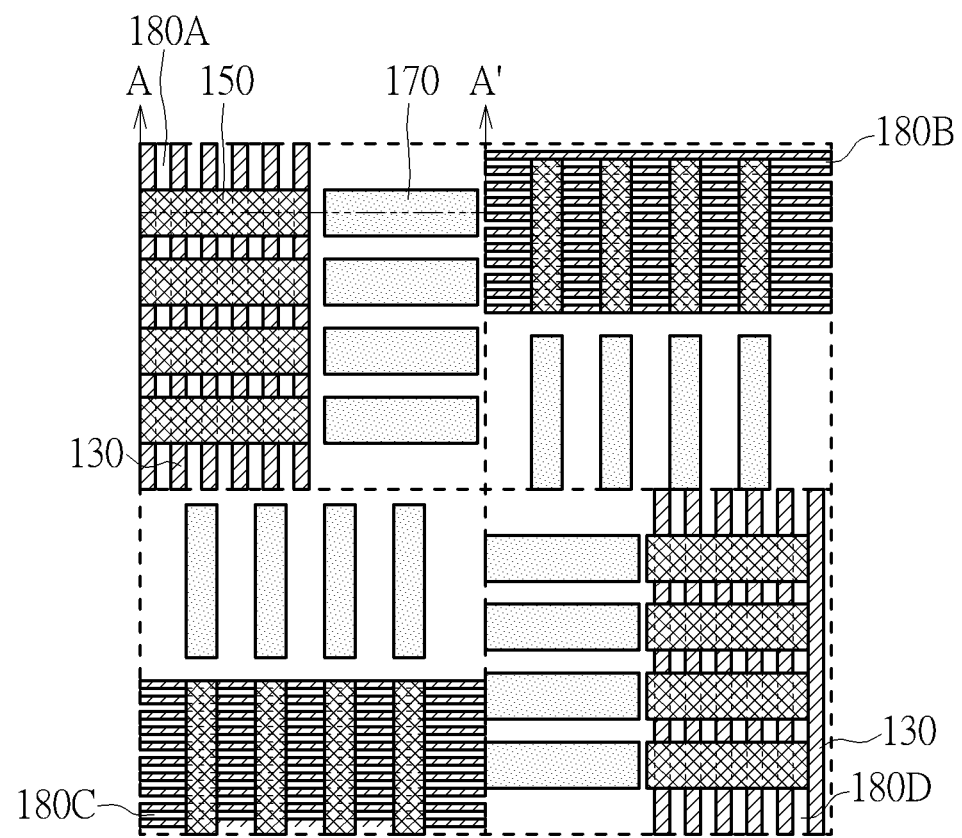

Alternatively, in another embodiment, one of the overlay marks 150 or 170 may be disposed on the region where no apparent periodic structure is formed on the substrate. As shown in FIG. 7 of a cross-sectional view taken along the line A-A' in FIG. 10, which depicts an alternative exemplary configuration of overlay/alignment marks corresponding to the patterns of the substrate in different zones.

Please note that the overlay marks 150 and 170 formed along with the two successive layers in one pattern zone may have the same width (i.e. critical dimension), and the pitches of the overlay marks 150 and 170 may be configured depending on the pitch of fins 135 (i.e. the periodic structure) formed on the substrate 100.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An overlay mark, formed along with two successive layers above a substrate, wherein both said substrate and said overlay mark comprise at least two pattern zones having periodic structures with different orientations, and said periodic structures of said overlay mark formed along with at least one of said two successive layers are orthogonally overlapped with said periodic structures of said substrate.

2. The overlay mark of claim 1, wherein said periodic structures of said overlay mark formed along with said two successive layers are both orthogonally overlapped with said periodic structures of said substrate.

3. The overlay mark of claim 1, wherein said periodic structures of said substrate in different pattern zones have different pitches.

4. The overlay mark of claim 1, wherein said periodic structures formed along with one of said two successive layers is juxtaposed with said periodic structures formed along with the other one of said two successive layers with the same orientation.

5. The overlay mark of claim 1, wherein said two successive layers are a gate layer and contact photoresist.

6. The overlay mark of claim 1, wherein said two successive layers are a gate layer and an inter-layer dielectric.

7. The overlay mark of claim 1, wherein said periodic structure of said substrate is fins, mandrels or trenches.

8. The overlay mark of claim 1, wherein said periodic structure in said two successive layers is a parallel alignment bar.

9. The overlay mark of claim 1, wherein said periodic structures of said overlay mark formed along with said two successive layers are on different level.

10. An overlay mark, formed along with two successive layers above a substrate, wherein both said substrate and said overlay mark comprise only one pattern zone having periodic structures, and said periodic structures of said overlay mark formed along with at least one of said two successive layers are orthogonally overlapped with said periodic structures of said substrate.

11. The overlay mark of claim 10, wherein said periodic structures of said overlay mark formed along with said two successive layers are both orthogonally overlapped with said periodic structures of said substrate.

12. The overlay mark of claim 10, wherein said periodic structures formed along with one of said two successive layers is juxtaposed with said periodic structures formed along with the other one of said two successive layers with the same orientation.

13. The overlay mark of claim 10, wherein said two successive layers are a gate layer and contact photoresist.

14. The overlay mark of claim 10, wherein said two successive layers are a gate layer and an inter-layer dielectric.

15. The overlay mark of claim 10, wherein said periodic structure of said substrate is fins, mandrels or trenches.

16. The overlay mark of claim 10, wherein said periodic structure in said two successive layers is a parallel alignment bar.

17. The overlay mark of claim 10, wherein said periodic structures of said overlay mark formed along with said two successive layers are on different level.

18. A semiconductor process of forming overlay marks, comprising:
   patterning a substrate to form periodic structures in at least two pattern zones, wherein said periodic structures in different said pattern zones have different orientations; and
   forming two successive layers with respective overlay marks above said substrate, wherein both said overlay marks have at least two said pattern zones, wherein said pattern zone has periodic structures with different orientations, and said periodic structures of said two successive layers are orthogonally overlapped with said periodic structures of said substrate.

19. The semiconductor process of forming overlay marks of claim 18, wherein said periodic structures in one of said two successive layers is juxtaposed with said periodic structures with the same orientation in the other one of said two successive layers.

20. The semiconductor process of forming overlay marks of claim 18, wherein said periodic structures with different orientations have different pitches.

* * * * *